United States Patent
Bhat et al.

(10) Patent No.: US 11,515,132 B2
(45) Date of Patent: *Nov. 29, 2022

(54) PHYSICAL VAPOR DEPOSITION PROCESSING SYSTEMS TARGET COOLING

(71) Applicant: Applied Materials, Inc., Santa Clara, CA (US)

(72) Inventors: Sanjay Bhat, Singapore (SG); Vibhu Jindal, San Jose, CA (US); Vishwas Kumar Pandey, Ujjain (IN)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/316,883

(22) Filed: May 11, 2021

(65) Prior Publication Data

US 2021/0272785 A1    Sep. 2, 2021

Related U.S. Application Data

(63) Continuation of application No. 16/867,878, filed on May 6, 2020, now Pat. No. 11,037,769, which is a
(Continued)

(51) Int. Cl.
*H01J 37/34* (2006.01)
*C23C 14/34* (2006.01)
(Continued)

(52) U.S. Cl.
CPC ........ *H01J 37/3497* (2013.01); *B23K 1/0008* (2013.01); *B23K 1/19* (2013.01); *B23K 1/20* (2013.01); *B23K 15/006* (2013.01); *B23K 15/0053* (2013.01); *B23K 15/0086* (2013.01); *C22C 9/04* (2013.01); *C22C 9/06* (2013.01); *C23C 14/3407* (2013.01); *C23C 14/35* (2013.01); *C23C 14/54* (2013.01); *C23C 14/541* (2013.01); *H01J 37/3405* (2013.01); *H01J 37/3435* (2013.01); *B23K 2103/12* (2018.08)

(58) Field of Classification Search
None
See application file for complete search history.

(56) References Cited

U.S. PATENT DOCUMENTS 3,649,512 A    3/1972 Ackley
4,569,745 A    2/1986 Nagashima
(Continued)

FOREIGN PATENT DOCUMENTS

CN    101100741 A    1/2008
CN    101104921 A    1/2008
(Continued)

OTHER PUBLICATIONS

PCT International Search Report and Written Opinion in PCT/US2018/013802 dated Jun. 27, 2018, 15 pages.
(Continued)

*Primary Examiner* — Jason Berman
(74) *Attorney, Agent, or Firm* — Servilla Whitney LLC

(57) ABSTRACT

Physical vapor deposition target assemblies and methods of manufacturing such target assemblies are disclosed. An exemplary target assembly comprises a flow pattern including a plurality of arcs and bends fluidly connected to an inlet end and an outlet end.

14 Claims, 10 Drawing Sheets

Related U.S. Application Data continuation of application No. 15/680,975, filed on Aug. 18, 2017, now Pat. No. 10,685,821.

(51) Int. Cl.

| | | |
|---|---|---|
| C23C 14/35 | (2006.01) | |
| C22C 9/04 | (2006.01) | |
| C22C 9/06 | (2006.01) | |
| B23K 15/00 | (2006.01) | |
| B23K 1/20 | (2006.01) | |
| B23K 1/00 | (2006.01) | |
| B23K 1/19 | (2006.01) | |
| C23C 14/54 | (2006.01) | |
| B23K 103/12 | (2006.01) | |

(56) References Cited

U.S. PATENT DOCUMENTS

| | | |
|---|---|---|
| 4,826,584 A | 5/1989 | Dos Santos Pereiro |
| 5,021,139 A | 6/1991 | Hartig et al. |
| 5,262,030 A | 11/1993 | Potter |
| 6,113,754 A | 9/2000 | Oh et al. |
| 6,840,427 B2 | 1/2005 | Ivanov |
| 10,325,763 B2 | 6/2019 | Wang et al. |
| 10,685,821 B2 * | 6/2020 | Bhat .................. H01J 37/3435 |
| 2002/0100680 A1 | 8/2002 | Yamamoto et al. |
| 2006/0260936 A1 | 11/2006 | Hort et al. |
| 2007/0051624 A1 | 3/2007 | Okabe |
| 2014/0061039 A1 | 3/2014 | Riker et al. |
| 2014/0132088 A1 | 5/2014 | Morel |
| 2018/0211826 A1 | 7/2018 | Wang et al. |

FOREIGN PATENT DOCUMENTS

| | | |
|---|---|---|
| DE | 4105786 A1 | 8/1992 |
| JP | S5956738 U | 4/1984 |
| JP | 2001329362 A | 11/2001 |
| JP | 2009062593 A | 3/2009 |
| JP | 2017115211 A | 6/2017 |
| WO | 2005064036 A1 | 7/2005 |
| WO | 2007024428 A2 | 3/2007 |
| WO | 2017/083113 A1 | 5/2017 |

OTHER PUBLICATIONS

Wang, Wei W., et al., "U.S. Appl. No. 15/411,579, filed Jan. 20, 2017, 48 pages".
Machine translation of JP2017115211A.
Machine translation of JP2001329362A.

* cited by examiner

PHYSICAL VAPOR DEPOSITION PROCESSING SYSTEMS TARGET COOLING

CROSS-REFERENCE TO RELATED APPLICATIONS

This application is a continuation of U.S. patent application Ser. No. 16/867,878, filed May 6, 2020, which is a continuation of U.S. patent application Ser. No. 15/680,975, filed Aug. 18, 2017, now U.S. Pat. No. 10,685,821, issued Jun. 16, 2020, the subject matter thereof incorporated herein by reference.

TECHNICAL FIELD

The present disclosure relates generally to substrate processing systems, and more specifically, to physical vapor deposition (PVD) processing systems.

BACKGROUND

Sputtering, alternatively called physical vapor deposition (PVD), has long been used in depositing metals and related materials in the fabrication of semiconductor integrated circuits. Use of sputtering has been extended to depositing metal layers onto the sidewalls of high aspect-ratio holes such as vias or other vertical interconnect structures, as well as in the manufacture of extreme ultraviolet (EUV) mask blanks. In the manufacture of EUV mask blanks minimization of particle generation is desired, because particles negatively impact the properties of the final product.

Plasma sputtering may be accomplished using either DC sputtering or RF sputtering. Plasma sputtering typically includes a magnetron positioned at the back of the sputtering target to project a magnetic field into the processing space to increase the density of the plasma and enhance the sputtering rate. Magnets used in the magnetron are typically closed loop for DC sputtering and open loop for RF sputtering.

In plasma enhanced substrate processing systems, such as physical vapor deposition (PVD) chambers, high power density PVD sputtering with high magnetic fields and high DC Power can produce high energy at a sputtering target, and cause a large rise in surface temperature of the sputtering target. The sputtering target is cooled by contacting a target backing plate with cooling fluid. However, it has been determined that such cooling may not be sufficient to capture and remove heat from the target. Remaining heat in the target can result in significant mechanical bowing due to thermal gradient in the sputter material and across backing plate. The mechanical bowing increases as larger size wafers are being processed. This additional size aggravates the tendency of the target to bow/deform under thermal, pressure and gravitational loads. The impacts of bowing may include mechanical stress induced in the target material that can lead to fracture, damage to the target, and changes in distance from a magnet assembly to the face of the target material that can cause changes in the plasma properties (e.g., moving the processing regime out of an optimal or desired processing condition which affects the ability to maintain plasma, sputter/deposition rate, and erosion of the target).

In addition, higher target temperature results in re-sputtering of target material, which causes particle generation and defects on other parts of the PVD chamber and the wafer being processed in the chamber. The thermal management of target cooling is important not only for target life but also for reducing particles and defects, which will improve process yield. There is need to provide apparatus and methods to efficiently cool PVD targets during physical vapor deposition processes.

SUMMARY

One or more embodiments of the disclosure are directed to a physical vapor deposition target assembly comprising a source material; a backing plate having a front side and a back side, the backing plate configured to support the source material on a front side of the backing plate; and a cooling channel formed in the backing plate including an inlet end configured to be connected to a cooling fluid, an outlet end fluidly coupled to the inlet end, and the cooling channel comprising a plurality of arcs joined together by a plurality of bends between the inlet end and the outlet end, the backing plate configured to cool the source material during a physical vapor deposition process.

Another aspect of the disclosure pertains to a method of manufacturing a physical vapor deposition target assembly comprising forming a backing plate having a front side and a back side, the backing plate configured to support a source material on a front side of the backing plate; and forming a cooling channel in the backing plate including an inlet end configured to be connected to cooling fluid, an outlet end fluidly coupled to the inlet end, and the cooling channel comprising a plurality of arcs joined together by a plurality of bends between the inlet end and the outlet end, the backing plate configured to be to cool the source material during a physical vapor deposition process

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

The term "horizontal" as used herein is defined as a plane parallel to the plane or surface of a mask blank, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" indicates that there is direct contact between elements. The term "directly on" indicates that there is direct contact between elements with no intervening elements.

As used in this specification and the appended claims, the terms "precursor", "reactant", "reactive gas" and the like are used interchangeably to refer to any gaseous species that can react with the substrate surface.

Those skilled in the art will understand that the use of ordinals such as "first" and "second" to describe process regions do not imply a specific location within the processing chamber, or order of exposure within the processing chamber.

Figure 1:
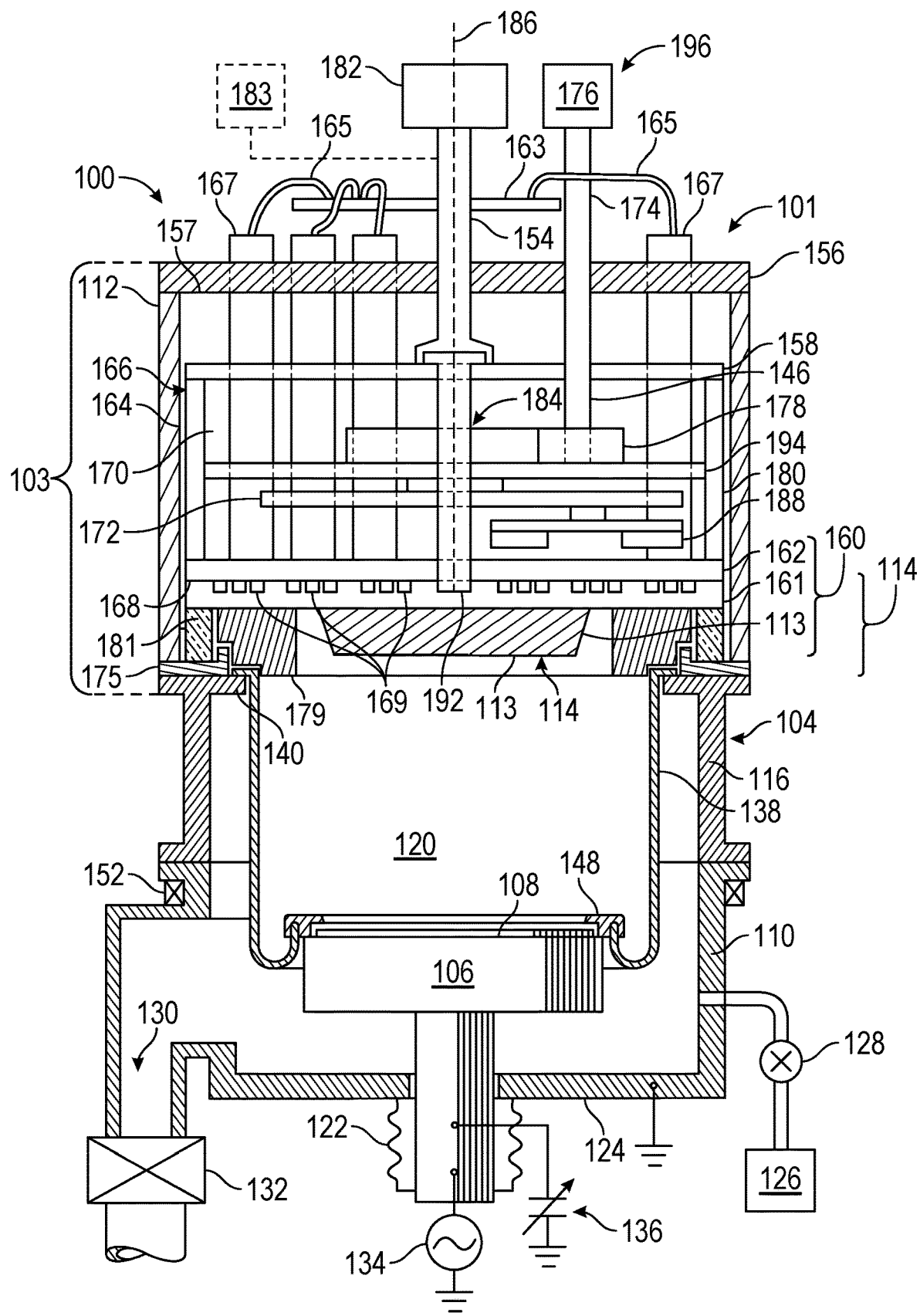
FIG. 1 depicts a schematic cross-sectional view of a process chamber in accordance with some embodiments of the present disclosure.

FIG. 1 depicts a simplified, cross-sectional view of a physical vapor deposition (PVD) processing system 100 in accordance with some embodiments of the present disclosure. Examples of other PVD chambers suitable for modification in accordance with the teachings provided herein include the ALPS® Plus and SIP ENCORE® PVD processing chambers, both commercially available from Applied Materials, Inc., of Santa Clara, Calif. Other processing chambers from Applied Materials, Inc. or other manufactures, including those configured for other types of processing besides PVD, may also benefit from modifications in accordance with the teachings disclosed herein.

In some embodiments of the present disclosure, the PVD processing system 100 includes a chamber body 101 removably disposed atop a process chamber 104. The chamber body 101 may include a target assembly 114 and a grounding assembly 103. The process chamber 104 contains a substrate support 106 for receiving a substrate 108 thereon. The substrate support 106 may be located within a lower grounded enclosure wall 110, which may be a chamber wall of the process chamber 104. The lower grounded enclosure wall 110 may be electrically coupled to the grounding assembly 103 of the chamber body 101 such that an RF return path is provided to an RF or DC power source 182 disposed above the chamber body 101. The RF or DC power source 182 may provide RF or DC power to the target assembly 114 as discussed below.

The substrate support 106 has a material-receiving surface facing a principal surface of a target assembly 114 and supports the substrate 108 to be sputter coated in planar position opposite to the principal surface of the target assembly 114. The substrate support 106 may support the substrate 108 in a central region 120 of the process chamber 104. The central region 120 is defined as the region above the substrate support 106 during processing (for example, between the target assembly 114 and the substrate support 106 when in a processing position).

In some embodiments, the substrate support 106 may be vertically movable to allow the substrate 108 to be transferred onto the substrate support 106 through a load lock valve (not shown) in the lower portion of the process chamber 104 and thereafter raised to a deposition, or processing position. A bellows 122 connected to a bottom chamber wall 124 may be provided to maintain a separation of the inner volume of the process chamber 104 from the atmosphere outside of the process chamber 104 while facilitating vertical movement of the substrate support 106. One or more gases may be supplied from a gas source 126 through a mass flow controller 128 into the lower part of the process chamber 104. An exhaust port 130 may be provided and coupled to a pump (not shown) via a valve 132 for exhausting the interior of the process chamber 104 and to facilitate maintaining a desired pressure inside the process chamber 104.

An RF bias power source 134 may be coupled to the substrate support 106 in order to induce a negative DC bias on the substrate 108. In addition, in some embodiments, a negative DC self-bias may form on the substrate 108 during processing. For example, RF energy supplied by the RF bias power source 134 may range in frequency from about 2 MHz to about 60 MHz, for example, non-limiting frequencies such as 2 MHz, 13.56 MHz, or 60 MHz can be used. In other applications, the substrate support 106 may be grounded or left electrically floating. Alternatively or in combination, a capacitance tuner 136 may be coupled to the substrate support 106 for adjusting voltage on the substrate 108 for applications where RF bias power may not be desired.

The process chamber 104 further includes a process kit shield, or shield 138 to surround the processing volume, or central region 120 of the process chamber 104 and to protect other chamber components from damage and/or contamination from processing. In some embodiments, the shield 138 may be connected to a ledge 140 of an upper grounded enclosure wall 116 of the process chamber 104. As illustrated in FIG. 1, the chamber body 101 may rest on the ledge 140 of the upper grounded enclosure wall 116. Similar to the lower grounded enclosure wall 110, the upper grounded enclosure wall 116 may provide a portion of the RF return path between the lower grounded enclosure wall 116 and the grounding assembly 103 of the chamber body 101. However, other RF return paths are possible, such as via the grounded shield 138.

The shield 138 extends downwardly and may include a generally tubular portion having a generally constant diameter that generally surrounds the central region 120. The shield 138 extends along the walls of the upper grounded enclosure wall 116 and the lower grounded enclosure wall 110 downwardly to below a top surface of the substrate support 106 and returns upwardly until reaching a top surface of the substrate support 106 (e.g., forming a u-shaped portion at the bottom of the shield 138). A cover ring 148 rests on the top of an upwardly extending inner portion of the shield 138 when the substrate support 106 is in its lower, loading position but rests on the outer periphery of the substrate support 106 when it is in its upper, deposition position to protect the substrate support 106 from sputter deposition. An additional deposition ring (not shown) may be used to protect the edges of the substrate support 106 from deposition around the edge of the substrate 108.

In some embodiments, a magnet 152 may be disposed about the process chamber 104 to selectively provide a magnetic field between the substrate support 106 and the target assembly 114. For example, as shown in FIG. 1, the magnet 152 may be disposed about the outside of the enclosure wall 110 in a region just above the substrate support 106 when in processing position. In some embodiments, the magnet 152 may be disposed additionally or alternatively in other locations, such as adjacent the upper grounded enclosure wall 116. The magnet 152 may be an electromagnet and may be coupled to a power source (not shown) for controlling the magnitude of the magnetic field generated by the electromagnet.

The chamber body 101 generally includes the grounding assembly 103 disposed about the target assembly 114. The grounding assembly 103 may include a grounding plate 156 having a first surface 157 that may be generally parallel to and opposite a backside of the target assembly 114. A grounding shield 112 may extend from the first surface 157 of the grounding plate 156 and surround the target assembly 114. The grounding assembly 103 may include a support member 175 to support the target assembly 114 within the grounding assembly 103.

In some embodiments, the support member 175 may be coupled to a lower end of the grounding shield 112 proximate an outer peripheral edge of the support member 175 and extends radially inward to support a seal ring 181, the target assembly 114 and optionally, a dark space shield 179. The seal ring 181 may be a ring or other annular shape having a desired cross-section. The seal ring 181 may include two opposing planar and generally parallel surfaces to facilitate interfacing with the target assembly 114, such as the backing plate assembly 160, on a first side of the seal ring 181 and with the support member 175 on a second side of the seal ring 181. The seal ring 181 may be made of a dielectric material, such as ceramic. The seal ring 181 may insulate the target assembly 114 from the ground assembly 103.

The dark space shield 179 is generally disposed about an outer edge of the target assembly 114, such about an outer edge of a source material 113 of the target assembly 114. In some embodiments, the seal ring 181 is disposed adjacent to an outer edge of the dark space shield 179 (i.e., radially outward of the dark space shield 179). In some embodiments, the dark space shield 179 is made of a dielectric material, such as ceramic. By providing a dark space shield 179, arcing between the dark space shield and adjacent components that are RF hot may be avoided or minimized. Alternatively, in some embodiments, the dark space shield 179 is made of a conductive material, such as stainless steel, aluminum, or the like. By providing a conductive dark space shield 179 a more uniform electric field may be maintained within the PVD processing system 100, thereby promoting more uniform processing of substrates therein. In some embodiments, a lower portion of the dark space shield 179 may be made of a conductive material and an upper portion of the dark space shield 179 may be made of a dielectric material.

The support member 175 may be a generally planar member having a central opening to accommodate the dark space shield 179 and the target assembly 114. In some embodiments, the support member 175 may be circular, or disc-like in shape, although the shape may vary depending upon the corresponding shape of the chamber lid and/or the shape of the substrate to be processed in the PVD processing system 100. In use, when the chamber body 101 is opened or closed, the support member 175 maintains the dark space shield 179 in proper alignment with respect to the target assembly 114, thereby minimizing the risk of misalignment due to chamber assembly or opening and closing the chamber body 101.

The PVD processing system 100 may include a source distribution plate 158 opposing a backside of the target assembly 114 and electrically coupled to the target assembly 114 along a peripheral edge of the target assembly 114. The target assembly 114 may comprise a source material 113 to be deposited on a substrate, such as the substrate 108 during sputtering, such as a metal, metal oxide, metal alloy, or the like. In one or more embodiments, the target assembly 114 includes a backing plate assembly 160 to support the source material 113. The source material 113 may be disposed on a substrate support facing side of the backing plate assembly 160 as illustrated in FIG. 1. The backing plate assembly 160 may comprise a conductive material, such as copper-zinc, copper-chrome, or the same material as the target, such that RF and DC power can be coupled to the source material 113 via the backing plate assembly 160. Alternatively, the backing plate assembly 160 may be non-conductive and may include conductive elements (not shown) such as electrical feedthroughs or the like.

In one or more embodiments, the backing plate assembly 160 includes a backing plate 161 and a cover plate 162. The backing plate 161 and the cover plate 162 may be disc shaped, rectangular, square, or any other shape that may be accommodated by the PVD processing system 100. A front side of the backing plate is configured to support the source material 113 such that a front surface of the source material opposes the substrate 108 when present. The source material 113 may be coupled to the backing plate 161 in any suitable manner. For example, in some embodiments, the source material 113 may be diffusion bonded to the backing plate 161.

A plurality of channels 169 may be disposed between the backing plate 161 and the cover plate 162. In one or more embodiments, the backing plate 161 may have the plurality of channels 169 formed in a backside of the backing plate 161 with the cover plate 162 providing a cap/cover over each of the channels. In other embodiments, the plurality of channels 169 may be formed partially in the backing plate 161 and partially in the cover plate 162. Still, in other embodiments, the plurality of channels 169 may be formed entirely in the cover plate 162, while the backing plate caps/covers each of the plurality of channels 169. The backing plate 161 and the cover plate 162 may be coupled together.

In some embodiments, the cover plate 162 is eliminated, and the backing plate 161 is a monolithic material. Such a backing plate 161 of monolithic material can be formed by 3D printing, and the plurality of channels 169 are formed during the 3D printing process. In some embodiments, the plurality of channels 169 are configured to flow cooling fluid, and the backing plate 161 and the cover plate 162 are coupled together to form a substantially water tight seal (e.g., a fluid seal between the backing plate 161 and the cover plates 162) to prevent leakage of coolant provided to the plurality of channels 169. That is, the cooling fluid is in direct contact with the channels 169. For example, in some embodiments, the backing plate 161 and the cover plate 162 are brazed together to form a substantially water tight seal or they may be coupled by diffusion bonding, brazing, gluing, pinning, riveting, or any other fastening means to provide a liquid seal, and the channels 169 formed between the backing plate 161 and the cover plate 162 directly contact cooling fluid. However, in other embodiments, the backing plate 161 has the plurality of channels 169 machined therein. The cover plate 162 is then optionally machined (or not machined). Brazing paste is placed between the backing plate 161 and the cover plate 162. Electron beam (E-beam) welding is then utilized to fasten the backing plate 161 and the cover plate 162 together. Thereafter, the fastened components can be heated to complete the fastening process, and then the fastened components may be machined to the final tolerance and specifications. Then the source material in the form of a target can be bonded to the backing plate 161 or cover plate 162 with indium solder. As will be described further below, according to some embodiments of the instant disclosure, a fluid tight seal between the backing plate 161 and the cover plate 162 is not necessary because the cooling fluid is contained within tubing which is disposed within the channels 169.

The backing plate 161 and the cover plate 162 may comprise an electrically conductive material, such as an electrically conductive metal or metal alloy including brass, aluminum, copper, aluminum alloys, copper alloys, or the like. In some embodiments, the backing plate 161 may be a machinable metal or metal alloy (e.g., C18200 chromium copper alloy) such that the channels may be machined or otherwise created on a surface of the backing plate 161. In some embodiments, the cover plate 162 may be a machinable metal or metal alloy, (e.g., C18200 chromium copper alloy) having a stiffness/elastic modulus greater than the metal or metal alloy of the backing plate to provide improved stiffness and lower deformation of backing plate assembly 160. The materials and sizes of the backing plate 161 and the cover plate 162 should be such that the stiffness of the entire backing plate assembly 160 will withstand the vacuum, gravitational, thermal, and other forces exerted on the target assembly 114 during deposition process, without (or with very little) deformation or bowing of the target assembly 114 including the source material 113 (i.e., such that the front of surface source material 113 remains substantially parallel to the top surface of a substrate 108).

In some embodiments, the overall thickness of the target assembly 114 may be between about 20 mm to about 100 mm. For example, the source material 113 may be about 10 to about 15 mm thick and the backing plate assembly may be about 10 to about 30 mm thick. Other thicknesses may also be used.

The plurality of channels 169 may include one or more sets of channels (discussed in detail below). For example, in some exemplary embodiments there may one set of channels. In other embodiments, there may two or more sets of channels. The size and cross-sectional shape of each channel, as well as the number of channels in each set and number of channels may be optimized based on one or more of the following characteristics: to provide a desired maximum flow rate through the channel and in total through all channels; to provide maximum heat transfer characteristics; ease and consistency in manufacturing channels within the backing plate 161 and the cover plate 162; to provide the most heat exchange flow coverage over the surfaces of the backing plate assembly 160 while retaining enough structural integrity to prevent deformation of the backing plate assembly 160 under load, etc. In some embodiments, the cross-sectional shape of each channel may be rectangular, polygonal, elliptical, circular, and the like.

In some embodiments the target assembly includes one or more inlets (not shown in FIG. 1 and discussed in detail below) fluidly coupled with the channels 169 or with tubing. The one or more inlets are configured to receive a heat exchange fluid and to provide the heat exchange fluid to the plurality of channels 169 or to the tubing. For example, at least one of the one or more inlets may be a plenum to distribute the heat exchange fluid to the plurality of channels 169 or to tubing. The assembly further includes one or more outlets (not shown in FIG. 1 and discussed in detail below) disposed through the cover plate 162 and fluidly coupled to a corresponding inlet by the plurality of channels 169 or tubing. For example, at least one of the one or more outlets may be a plenum to collect the heat exchange fluid from a plurality of the one or more channels or tubing. In some embodiments, one inlet and one outlet are provided and each set of channels in the plurality of set of channels 169 is fluidly coupled to the one inlet and the one outlet.

The inlets and outlets may be disposed on or near a peripheral edge of the cover plate 162 or backing plate 161. In addition, the inlets and outlets may be disposed on the cover plate 162 such that supply conduits 167 coupled to the one or more inlets, and return conduits coupled to the one or more outlets, do not interfere with the rotation of a magnetron assembly 196 in cavity 170. In other embodiments, the inlets and outlets may be disposed on the backing plate 161 such that supply conduits 167 coupled to the one or more inlets, and return conduits (not shown due to cross section) coupled to the one or more outlets, do not interfere with the rotation of a magnetron assembly 196 in cavity 170. In still other embodiments, the inlets and outlets may be coupled to tubing such that supply conduits 167 coupled to the one or more inlets, and return conduits (not shown due to cross section), coupled to the one or more outlets, do not interfere with the rotation of a magnetron assembly 196 in cavity 170.

In some embodiments, PVD processing system 100 may include one or more supply conduits 167 to supply heat exchange fluid to the backing plate assembly 160. In some embodiments, each inlet may be coupled to a corresponding supply conduit 167. Similarly, each outlet may be coupled to a corresponding return conduit. Supply conduits 167 and return conduits may be made of insulating materials. The supply conduit 167 may include a seal ring (e.g., a compressible o-ring or similar gasket material) to prevent heat exchange fluid leakage between the supply conduit 167 and an inlet. In some embodiments, a top end of supply conduits 167 may be coupled to a fluid distribution manifold 163 disposed on the top surface of the chamber body 101. The fluid distribution manifold 163 may be fluidly coupled to the plurality of supply conduits 167 to supply heat exchange fluid to each of the plurality of supply conduits via supply lines 165. Similarly, a top end of return conduits may be coupled to a return fluid manifold (not shown, but similar to 163) disposed on the top surface of the chamber body 101. The return fluid manifold may be fluidly coupled to the plurality of return conduits to return heat exchange fluid from each of the plurality of return conduits via return lines.

The fluid distribution manifold 163 may be coupled to a heat exchange fluid source (not shown) to provide a heat exchange fluid in the form of a liquid to the backing plate assembly 160. The heat exchange fluid may be any process compatible liquid coolant, such as ethylene glycol, deionized water, a perfluorinated polyether (such as Golden®, available from Solvay S. A.), or the like, or solutions or combinations thereof. In some embodiments, the flow of coolant through the channels 169 or tubing may be about 8 to about 20 gallons per minute, in sum total, although the exact flows will depend upon the configuration of the coolant channels, available coolant pressure, or the like.

A conductive support ring 164, having a central opening, is coupled to a backside of the cover plate 162 along a peripheral edge of the cover plate 162. In some embodiments, in place of separate supply and return conduits, the conductive support ring 164 may include a ring inlet to receive heat exchange fluid from a fluid supply line (not shown). The conductive support ring 164 may include an inlet manifold, disposed within the body of the conductive support ring 164, to distribute the heat exchange fluid to an inlet connected to tubing or the channels 169. The conductive support ring 164 may include an outlet manifold, disposed within the body of the conductive support ring 164, to receive the heat exchange fluid from one or more outlets, and a ring outlet to output the heat exchange fluid from the conductive support ring 164. The conductive support ring 164 and the backing plate assembly 160 may be threaded together, pinned, bolted, or fastened in a process compatible manner to provide a liquid seal between the conductive support ring 164 and the cover plate 162. O-rings or other suitable gasket materials may be provided to facilitate providing a seal between the conductive support ring 164 and the cover plate 162.

In some embodiments, the target assembly 114 may further comprise a central support member 192 to support the target assembly 114 within the chamber body 101. The central support member 192 may be coupled to a center portion of the backing plate 161 and the cover plate 162 and extend perpendicularly away from the backside of the cover plate 162. In some embodiments, a bottom portion of the central support member 192 may be threaded into a central opening in the backing plate 161 and the cover plate 162. In other embodiments, a bottom portion of the central support member 192 may be bolted or clamped to a central portion of the backing plate 161 and the cover plate 162. A top portion of the central support member 192 may be disposed through the source distribution plate 158 and includes a feature which rests on a top surface of the source distribution plate 158 that supports the central support member 192 and target assembly 114.

In some embodiments, the conductive support ring 164 may be disposed between the source distribution plate 158 and the backside of the target assembly 114 to propagate RF energy from the source distribution plate to the peripheral edge of the target assembly 114. The conductive support ring 164 may be cylindrical, with a first end 166 coupled to a target-facing surface of the source distribution plate 158 proximate the peripheral edge of the source distribution plate 158 and a second end 168 coupled to a source distribution plate-facing surface of the target assembly 114 proximate the peripheral edge of the target assembly 114. In some embodiments, the second end 168 is coupled to a source distribution plate facing surface of the backing plate assembly 160 proximate the peripheral edge of the backing plate assembly 160.

The PVD processing system 100 may include a cavity 170 disposed between the backside of the target assembly 114 and the source distribution plate 158. The cavity 170 may at least partially house the magnetron assembly 196 as discussed below. The cavity 170 is at least partially defined by the inner surface of the conductive support ring 164, a target facing surface of the source distribution plate 158, and a source distribution plate facing surface (e.g., backside) of the target assembly 114 (or backing plate assembly 160).

An insulative gap 180 is provided between the grounding plate 156 and the outer surfaces of the source distribution plate 158, the conductive support ring 164, and the target assembly 114 (and/or backing plate assembly 160). The insulative gap 180 may be filled with air or some other suitable dielectric material, such as a ceramic, a plastic, or the like. The distance between the grounding plate 156 and the source distribution plate 158 depends on the dielectric material between the grounding plate 156 and the source distribution plate 158. Where the dielectric material is predominantly air, the distance between the grounding plate 156 and the source distribution plate 158 may be between about 15 mm and about 40 mm.

The grounding assembly 103 and the target assembly 114 may be electrically separated by the seal ring 181 and by one or more of insulators (not shown) disposed between the first surface 157 of the grounding plate 156 and the backside of the target assembly 114, e.g., a non-target facing side of the source distribution plate 158.

The PVD processing system 100 has an RF or DC power source 182 connected to an electrode 154 (e.g., a RF feed structure). The electrode 154 may pass through the grounding plate 156 and is coupled to the source distribution plate 158. The RF or DC power source 182 may include an RF generator and a matching circuit, for example, to minimize reflected RF energy reflected back to the RF generator during operation. For example, RF energy supplied by the RF or DC power source 182 may range in frequency from about 13.56 MHz to about 162 MHz or above. For example, non-limiting frequencies such as 13.56 MHz, 27.12 MHz, 40.68 MHz, 60 MHz, or 162 MHz can be used.

In some embodiments, the PVD processing system 100 may include a second energy source 183 to provide additional energy to the target assembly 114 during processing. In some embodiments, the second energy source 183 may be a DC power source to provide DC energy, for example, to enhance a sputtering rate of the target material (and hence, a deposition rate on the substrate). In some embodiments, the second energy source 183 may be a second RF power source, similar to the RF or DC power source 182, to provide RF energy, for example, at a second frequency different than a first frequency of RF energy provided by the RF or DC power source 182. In embodiments where the second energy source 183 is a DC power source, the second energy source may be coupled to target assembly 114 in any location suitable to electrically couple the DC energy to the target assembly 114, such as the electrode 154 or some other conductive member (such as the source distribution plate 158, discussed below). In embodiments where the second energy source 183 is a second RF power source, the second energy source may be coupled to the target assembly 114 via the electrode 154.

The electrode 154 may be cylindrical or otherwise rod-like and may be aligned with a central axis 186 of the PVD processing system 100 (e.g., the electrode 154 may be coupled to the target assembly at a point coincident with a central axis of the target, which is coincident with the central axis 186). The electrode 154, aligned with the central axis 186 of the PVD processing system 100, facilitates applying RF energy from the RF or DC power source 182 to the target assembly 114 in an axisymmetrical manner (e.g., the electrode 154 may couple RF energy to the target at a single point aligned with the central axis of the PVD chamber). The central position of the electrode 154 helps to eliminate or reduce deposition asymmetry in substrate deposition processes. The electrode 154 may have any suitable diameter. For example, although other diameters may be used, in some embodiments, the diameter of the electrode 154 may be about 0.5 to about 2 inches. The electrode 154 may generally have any suitable length depending upon the configuration of the PVD chamber. In some embodiments, the electrode may have a length of between about 0.5 to about 12 inches. The electrode 154 may be fabricated from any suitable conductive material, such as aluminum, copper, silver, or the like. Alternatively, in some embodiments, the electrode 154 may be tubular. In some embodiments, the diameter of the tubular electrode 154 may be suitable, for example, to facilitate providing a central shaft for the magnetron.

The electrode 154 may pass through the ground plate 156 and is coupled to the source distribution plate 158. The ground plate 156 may comprise any suitable conductive material, such as aluminum, copper, or the like. The open spaces between the one or more insulators (not shown) allow for RF wave propagation along the surface of the source distribution plate 158. In some embodiments, the one or more insulators may be symmetrically positioned with respect to the central axis 186 of the PVD processing system. Such positioning may facilitate symmetric RF wave propagation along the surface of the source distribution plate 158 and, ultimately, to a target assembly 114 coupled to the source distribution plate 158. The RF energy may be provided in a more symmetric and uniform manner as compared to conventional PVD chambers due, at least in part, to the central position of the electrode 154.

One or more portions of a magnetron assembly 196 may be disposed at least partially within the cavity 170. The magnetron assembly provides a rotating magnetic field proximate the target to assist in plasma processing within the chamber body 101. In some embodiments, the magnetron assembly 196 may include a motor 176, a motor shaft 174, a gear box 178, a gear box shaft assembly 184, and a rotatable magnet (e.g., a plurality of magnets 188 coupled to a magnet support member 172), and divider 194. In some embodiments, the magnetron assembly 196 remains stationary.

In some embodiments, the magnetron assembly 196 is rotated within the cavity 170. For example, in some embodiments, the motor 176, motor shaft 174, gear box 178, and gear box shaft assembly 184 may be provided to rotate the magnet support member 172. In conventional PVD chambers having magnetrons, the magnetron drive shaft is typically disposed along the central axis of the chamber, preventing the coupling of RF energy in a position aligned with the central axis of the chamber. In one or more embodiments, the electrode 154 is aligned with the central axis 186 of the PVD chamber. As such, in some embodiments, the motor shaft 174 of the magnetron may be disposed through an off-center opening in the ground plate 156. The end of the motor shaft 174 protruding from the ground plate 156 is coupled to a motor 176. The motor shaft 174 is further disposed through a corresponding off-center opening through the source distribution plate 158 (e.g., a first opening 146) and coupled to a gear box 178. In some embodiments, one or more second openings (not shown) may be disposed though the source distribution plate 158 in a symmetrical relationship to the first opening 146 to advantageously maintain axisymmetric RF distribution along the source distribution plate 158. The one or more second openings may also be used to allow access to the cavity 170 for items such as optical sensors or the like. In one or more embodiments, the backing plate assemblies described herein are particularly useful in multi-cathode PVD systems with rotating magnets. Prior art designs with larger cooling cavities limited the ability to utilize rotating magnets.

The gear box 178 may be supported by any suitable means, such as by being coupled to a bottom surface of the source distribution plate 158. The gear box 178 may be insulated from the source distribution plate 158 by fabricating at least the upper surface of the gear box 178 from a dielectric material, or by interposing an insulator layer (not shown) between the gear box 178 and the source distribution plate 158, or the like, or by constructing the motor shaft 174 out of a suitable dielectric material. The gear box 178 is further coupled to the magnet support member 172 via the gear box shaft assembly 184 to transfer the rotational motion provided by the motor 176 to the magnet support member 172 (and hence, the plurality of magnets 188).

The magnet support member 172 may be constructed from any material suitable to provide adequate mechanical strength to rigidly support the plurality of magnets 188. For example, in some embodiments, the magnet support member 172 may be constructed from a non-magnetic metal, such as non-magnetic stainless steel. The magnet support member 172 may have any shape suitable to allow the plurality of magnets 188 to be coupled thereto in a desired position. For example, in some embodiments, the magnet support member 172 may comprise a plate, a disk, a cross member, or the like. The plurality of magnets 188 may be configured in any manner to provide a magnetic field having a desired shape and strength.

Alternatively, the magnet support member 172 may be rotated by any other means with sufficient torque to overcome the drag caused on the magnet support member 172 and attached plurality of magnets 188, when present, in the cavity 170. For example, in some embodiments, (not shown), the magnetron assembly 196 may be rotated within the cavity 170 using a motor 176 and motor shaft 174 disposed within the cavity 170 and directly connected to the magnet support member 172 (for example, a pancake motor). The motor 176 must be sized sufficiently to fit within the cavity 170, or within the upper portion of the cavity 170 when the divider 194 is present. The motor 176 may be an electric motor, a pneumatic or hydraulic drive, or any other process-compatible mechanism that can provide the required torque.

Figure 2:
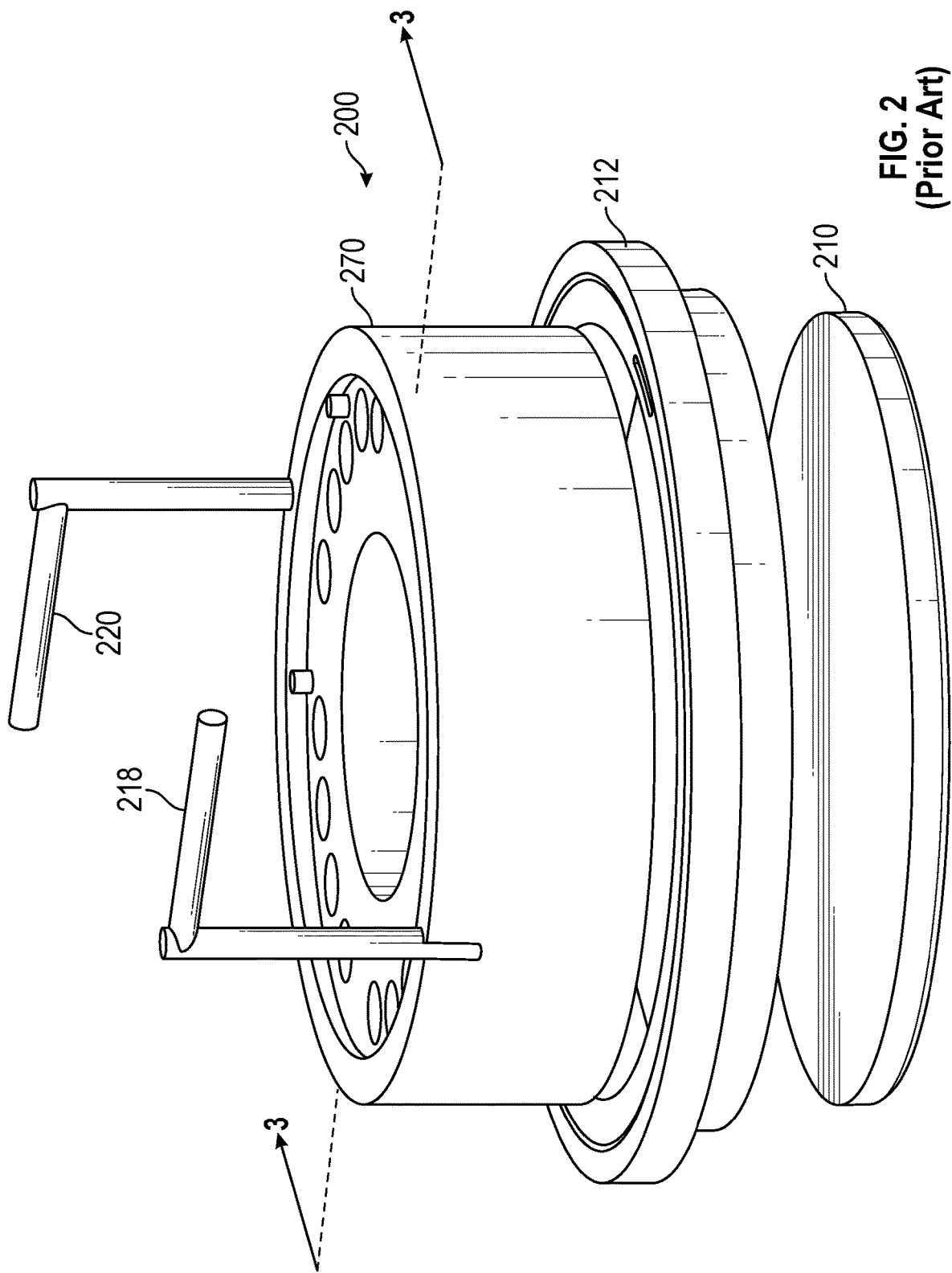
FIG. 2 illustrates a perspective view of prior art target assembly.
Figure 3:
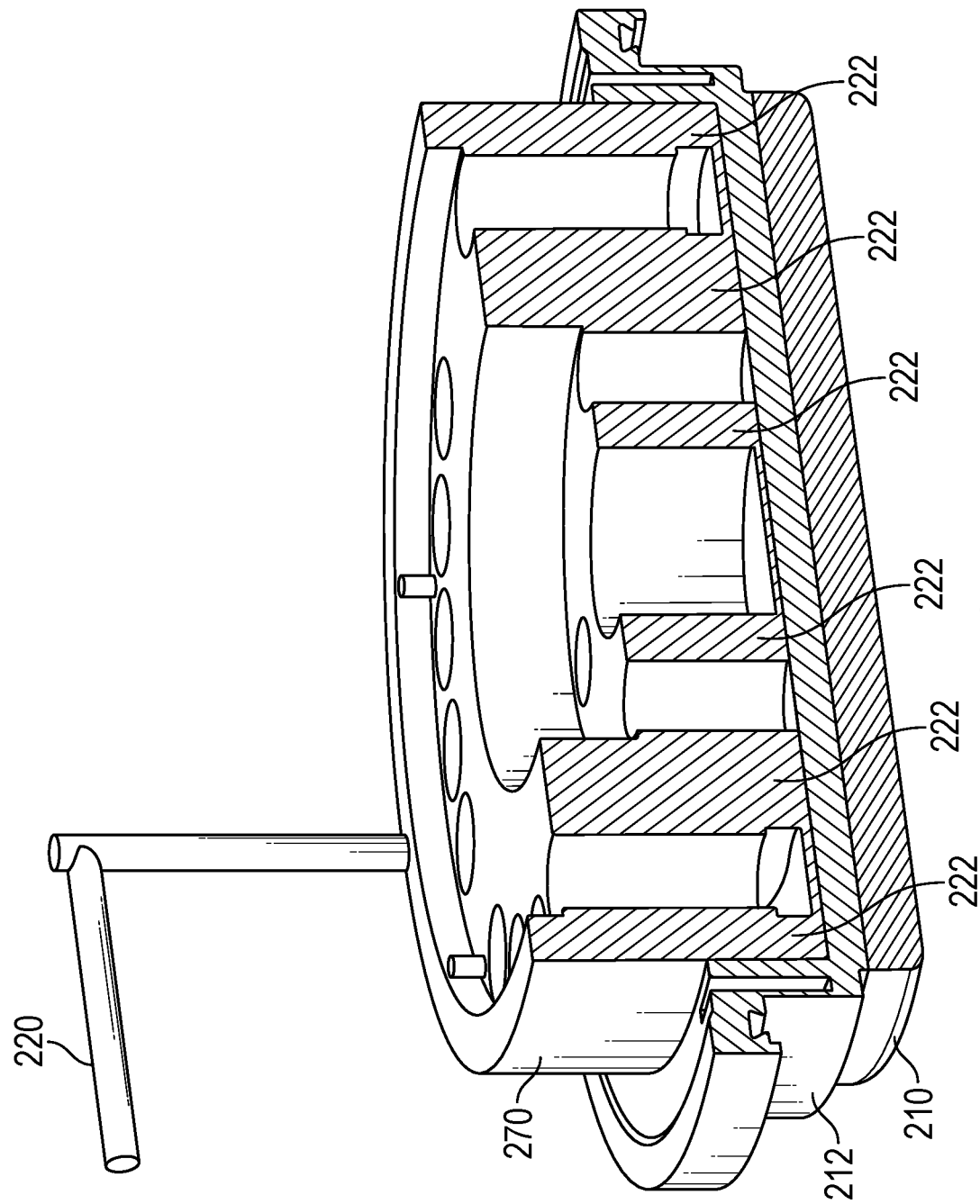
FIG. 3 illustrates a cross-sectional view taken along line 3-3 of FIG. 2.
Figure 4:
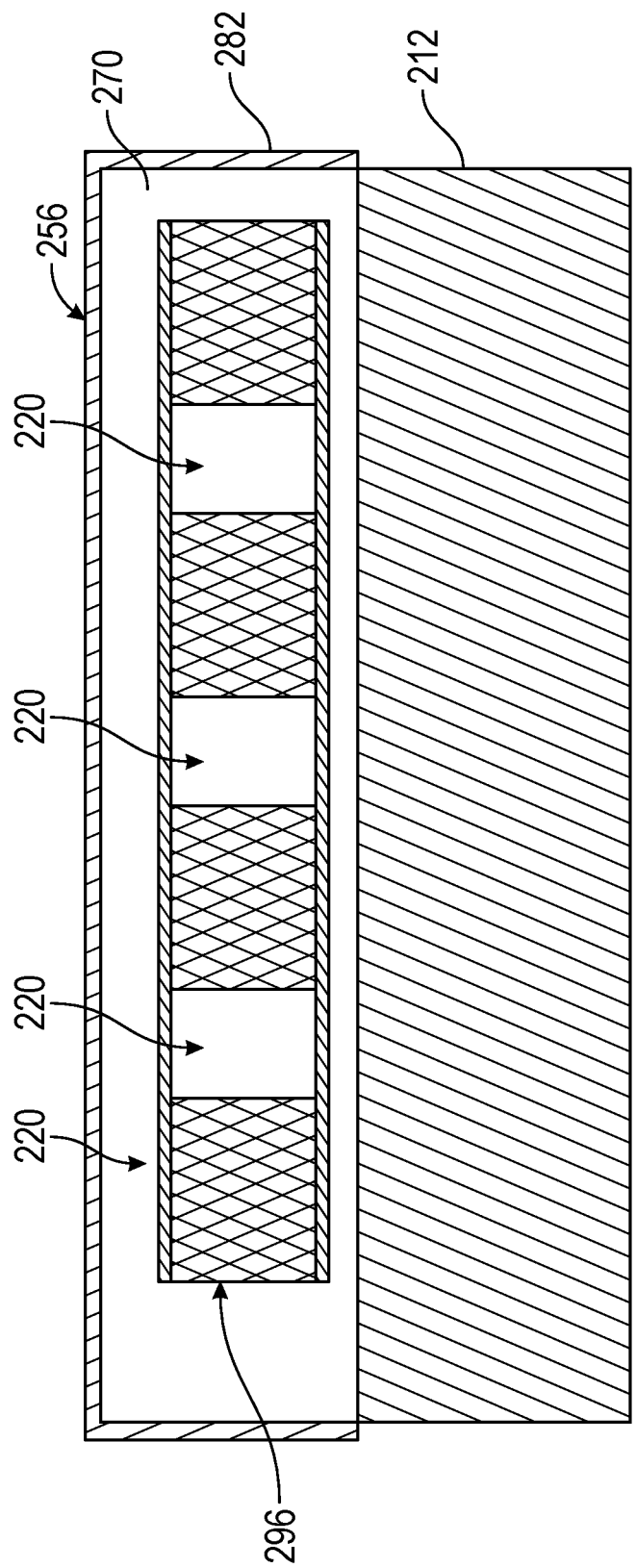
FIG. 4 illustrates a cross-sectional view of a prior art target assembly.

Referring now to FIGS. 2-4 a prior art target assembly 200 is shown, and includes a target 210, a backing plate 212, a grounding plate 256, a RF or DC power source 282 and a magnetron assembly 296 in a cavity 270 (shown in FIG. 4). The cavity 270 is a flow volume or cavity disposed between the backside of the target assembly and the source distribution plate, which also includes an extended portion of a fluid inlet end 218 and a fluid outlet end 220. In existing designs, this cavity corresponds to cavity 170 in FIG. 1, which is filled with heat exchange fluid for a target 210 cooling through backing plate 212 by flowing the heat exchange fluid over backing plate 212 without channels. FIG. 3 is a cross-sectional view taken along line 3-3 of FIG. 2 showing fluid conduits 222 formed in cavity disposed between the backside of the target assembly and the source distribution plate. FIG. 3 provides a simplified cross-sectional view of the fluid conduits 222 formed between the backside of the target assembly and the source distribution plate. In the configuration shown in FIGS. 2-4, the target 210 is cooled, but not effectively because cooling water is not replaced continuously, which causes a higher target temperature, which can lead to warping, spalling of the target, particle generation and defects.

Figure 5:
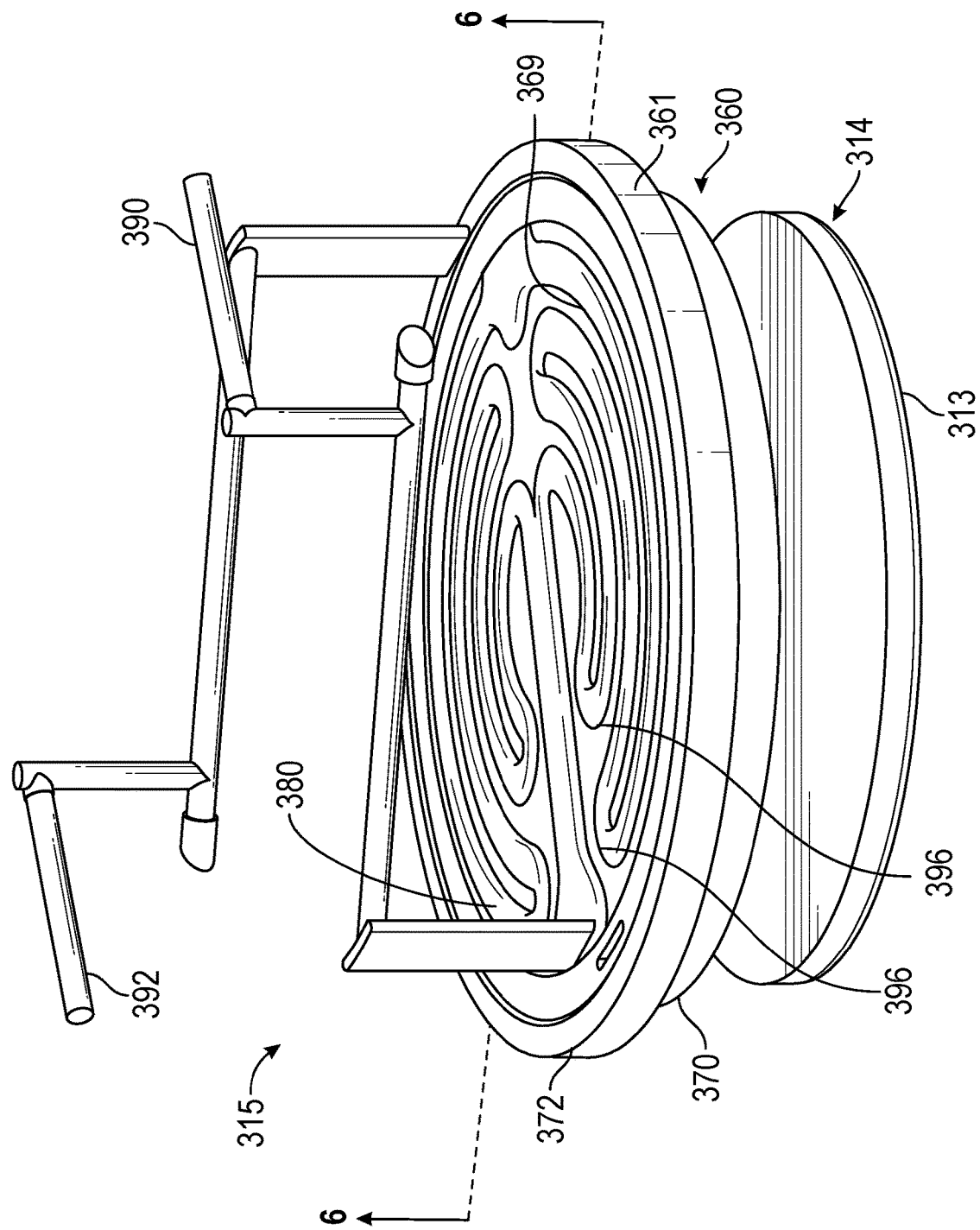
FIG. 5 illustrates a perspective view of a target assembly according to an embodiment.
Figure 6:
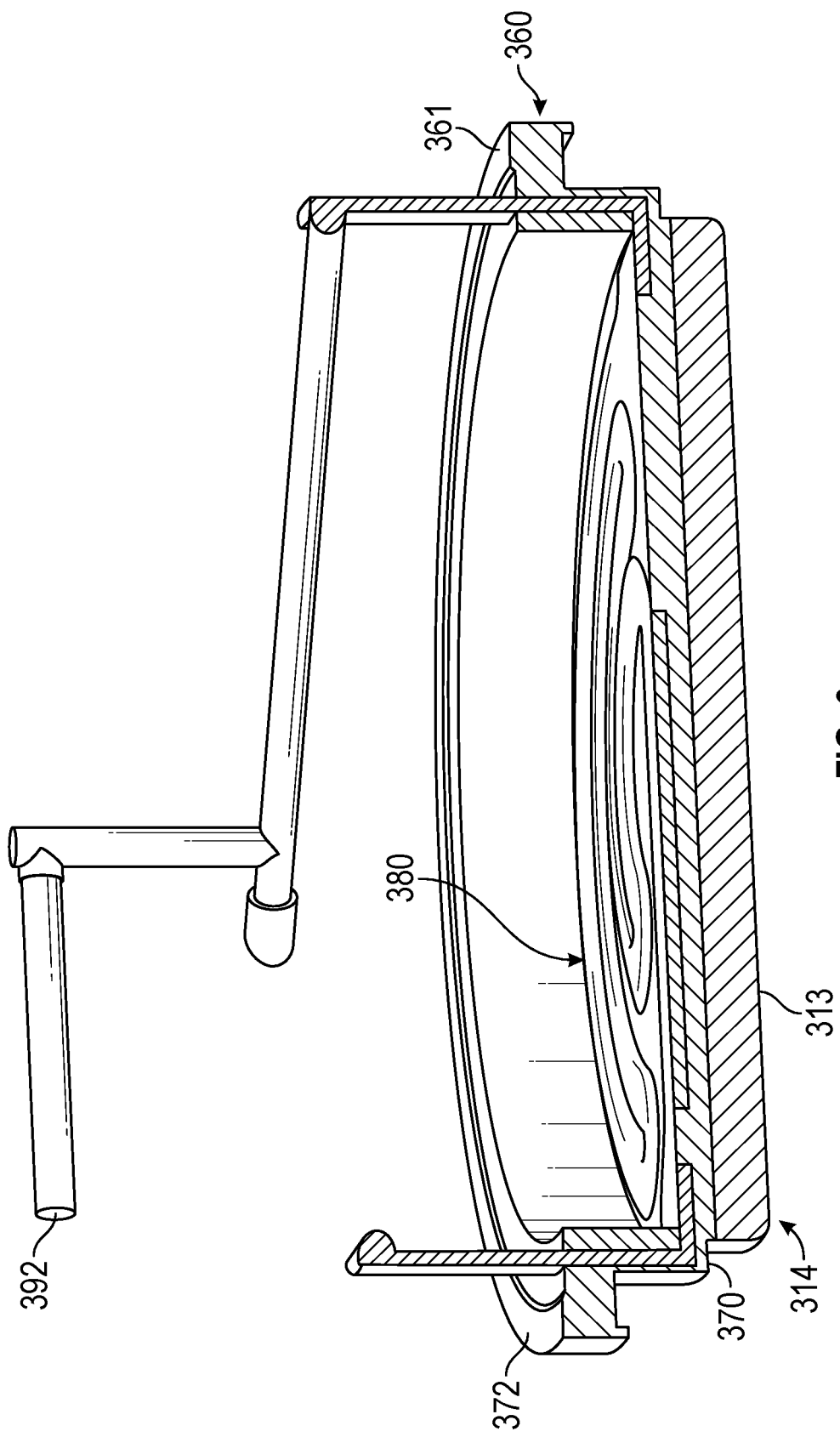
FIG. 6 illustrates a cross-sectional view taken along line 6-6 of FIG. 5.

Referring now to FIGS. 5 and 6 a first embodiment of a physical vapor deposition target assembly 314, which may be integrated as the target assembly of the PVD processing system 100 shown in FIG. 1. In the embodiment shown in FIGS. 5 and 6, the physical vapor deposition target assembly 314 comprises a source material 313 to be deposited on a substrate during a physical vapor deposition (or sputtering) process. The source material 313 can be a metal, metal oxide, metal alloy, or the like. In specific embodiments, the source material comprises molybdenum. In other specific embodiments, the source material comprises silicon or titanium or any other substance. In one or more embodiments, the target assembly 314 includes a backing plate assembly 360 to support the source material 313. The source material 313 may be disposed on a substrate support facing side of the backing plate assembly 360. The backing plate assembly 360 may comprise a conductive material, such as copper-zinc, copper-chrome, or the same material as the target, such that RF and DC power can be coupled to the source material 313 via the backing plate assembly 360. Alternatively, the backing plate assembly 360 may be non-conductive and may include conductive elements (not shown) such as electrical feedthroughs or the like.

In some specific embodiments, the backing plate 161, and when present, the cover plate 162, comprise a metal alloy having an electrical conductivity in a range of about 20-30% of International Annealed Copper Standard (IACS) and a thermal conductivity in a range of about 120-150 W/mK. Examples of such a metal alloy selected from a copper-nickel-silicon-chromium metal alloy and copper-zinc metal alloy containing lead and iron. In one or more specific embodiments, the metal alloy can comprise a Cu—Zn alloy such as C36000, which contains about 60-63 weight % copper (Cu) and about 2.5-3 weight percent lead (Pb). C36000 may also contain about 0.35 weight % iron (Fe) with the remainder of the alloy containing Zinc (Zn). In other specific embodiments, Cu—Ni—Si—Cr #2 the metal alloy can comprise a Cu—Ni—SI—Cr alloy, such as Cu—Ni—SI—Cr #2, which in some embodiments comprises about 87.4-91.7 weight percent copper (Cu), about 6.5-8.8 weight % nickel (Ni), about 1.5-2.5 weight % silicon (Si) and 0.3-1.3 weight % chromium (Cr). It has been determined that when components of the assembly are fastened together, the Cu—Ni—SI—Cr alloy provides specific benefits for E-beam welding and thermal and electrical conductivity. Such an alloy provides a process and a final product in which E-beam welding of the components occurs without failures such as leaks. It also decreases conductivity.

In one or more specific embodiments, the aforementioned Cu—Ni—Si—Cr or Cu—Zn alloys allow for the manufacture of the backing plate by using 3D printing. This allows for the cover plate 162 to be eliminated and the formation of a monolithic backing plate 161 using 3D printing. Thus, in one embodiment, the backing plate 161 may be manufactured using a 3D printing process. In the 3D printing process, thin layers are progressively deposited and fused until the edge of the backing plate 161 is complete. Each layer is applied by a nozzle of a 3D printer in a pattern stored by a 3D drawing computer program that runs on a computer (not shown). The plurality of channels 169 in the backing plate 161 may be formed using the 3D printing process. The 3D printing approach reduces expense and time required for conventional backing plate 161 manufacturing. The 3D printing process also eliminates several conventional backing plate manufacturing steps, such as molding, casting, and machining. Additionally, tight tolerances can be achieved due to layer-by-layer printing approach. One printing system can be used to manufacture a variety of different backing plates, with or without the plurality of channel 169, simply by changing the pattern stored in the 3D drawing computer program. The 3D printed parts may be subjected to post processing processes, such as hot isostatic pressing to minimize surface defects and porosity. Such 3D printing processes are also referred to as additive manufacturing ("AM"). In 3D printing processes, design data breaks the 3D object down into individual layers in two dimensional planes and the 3D object is built by adding the exact amount of material needed for each layer in an iterative manner. For this reason, 3D printing processes can include joining or densifying the deposited material via an energy source such as a laser, electron beam, or ion fusion melting. These techniques are capable of producing net shape, monolithic structures with intricate cavities and channels.

In one or more embodiments, the backing plate assembly 360 includes a backing plate 361. The backing plate assembly 360 may optionally include a cover plate 362 (shown in FIGS. 7A, 7B and 7C). The backing plate 361 and the optional cover plate 362 may be disc shaped, rectangular, square, or any other shape that may be accommodated by a PVD processing system 100 as shown in FIG. 1 or other suitable PVD processing systems. A front side 370 of the backing plate 361 is configured to support the source material 313 such that a front surface of the source material 313 opposes a substrate during a PVD process. The source material 313 may be coupled to the backing plate 361 in any suitable manner. For example, in some embodiments, the source material 313 may be diffusion bonded to the backing plate 361 or bonded with indium solder.

Figure 7B:
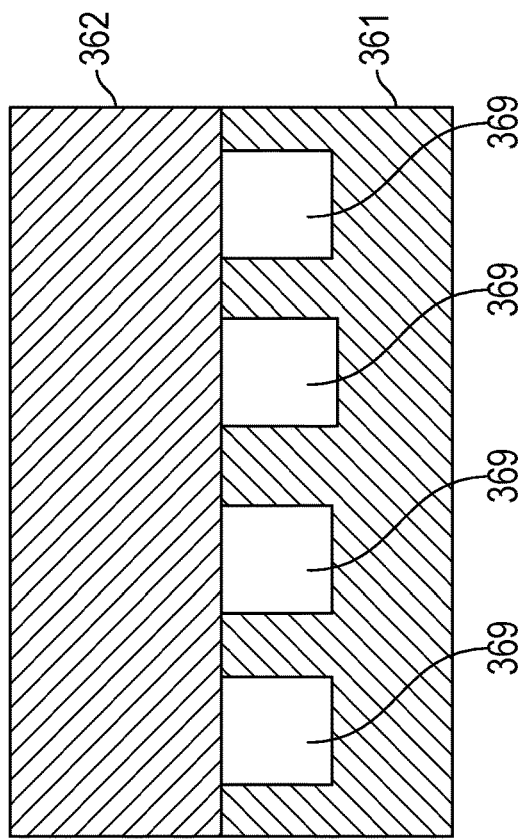
FIG. 7B illustrates a cross-sectional view of target assembly according to an embodiment.
Figure 7A:
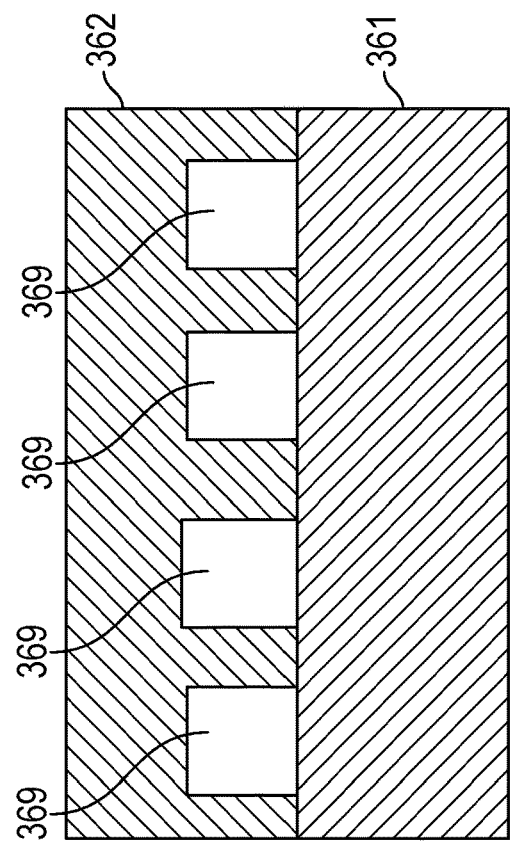
FIG. 7A illustrates a cross-sectional view of target assembly according to an embodiment.
Figure 7C:
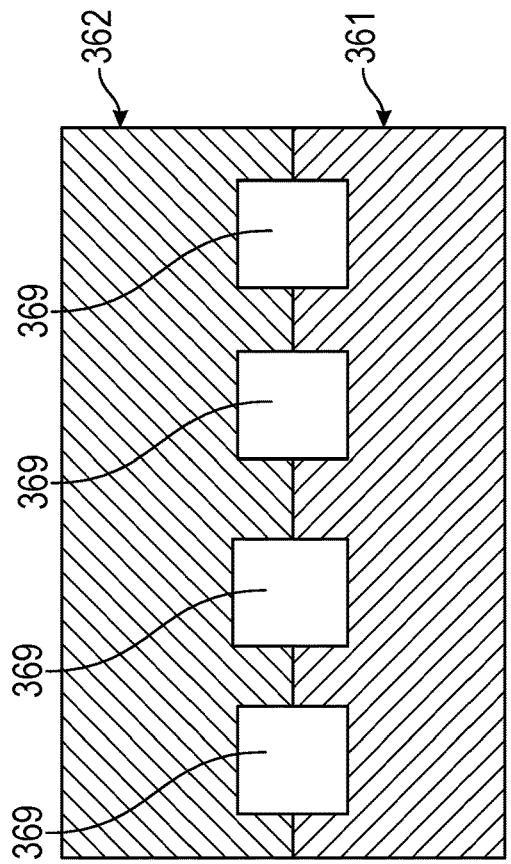
FIG. 7C illustrates a cross-sectional view of target assembly according to an embodiment.

A plurality of channels 369 may be disposed between the backing plate 361 and the cover plate 362. In one or more embodiments, the backing plate 361 may have the plurality of channels 369 formed in a backside of the backing plate 361 with the cover plate 362 providing a cap/cover over each of the channels, as shown in FIG. 7B. In. In other embodiments, the plurality of channels 369 may be formed partially in the backing plate 361 and partially in the cover plate 362 (as shown in FIG. 7C). Still, in other embodiments, the plurality of channels 369 may be formed entirely in the cover plate 362, while the backing plate 361 caps/covers each of the plurality of channels 369, as shown in FIG. 7A.

In some embodiments, the backing plate 361 and the cover plate 362 may be coupled together. In some embodiments, the plurality of channels 369 are configured to flow cooling fluid such as cooling liquid, and the backing plate 361 and the cover plate 362 are coupled together to form a substantially water tight or liquid tight seal (e.g., a fluid seal or liquid seal between the backing plate 361 and the cover plate 362) to prevent leakage of coolant provided to the plurality of channels 369. That is, the cooling fluid is in direct contact with the channels 369. For example, in some embodiments, the backing plate 361 and the cover plate 362 are brazed together to form a substantially water tight seal or they may be coupled by diffusion bonding, brazing, gluing, pinning, riveting, or any other fastening means to provide a liquid seal, and the channels 369 formed between the backing plate 361 and the cover plate 362 directly contact cooling fluid. In specific embodiments, the backing plate 361 and the cover plate 362 are electron beam (E-beam) welded together.

Figure 9:
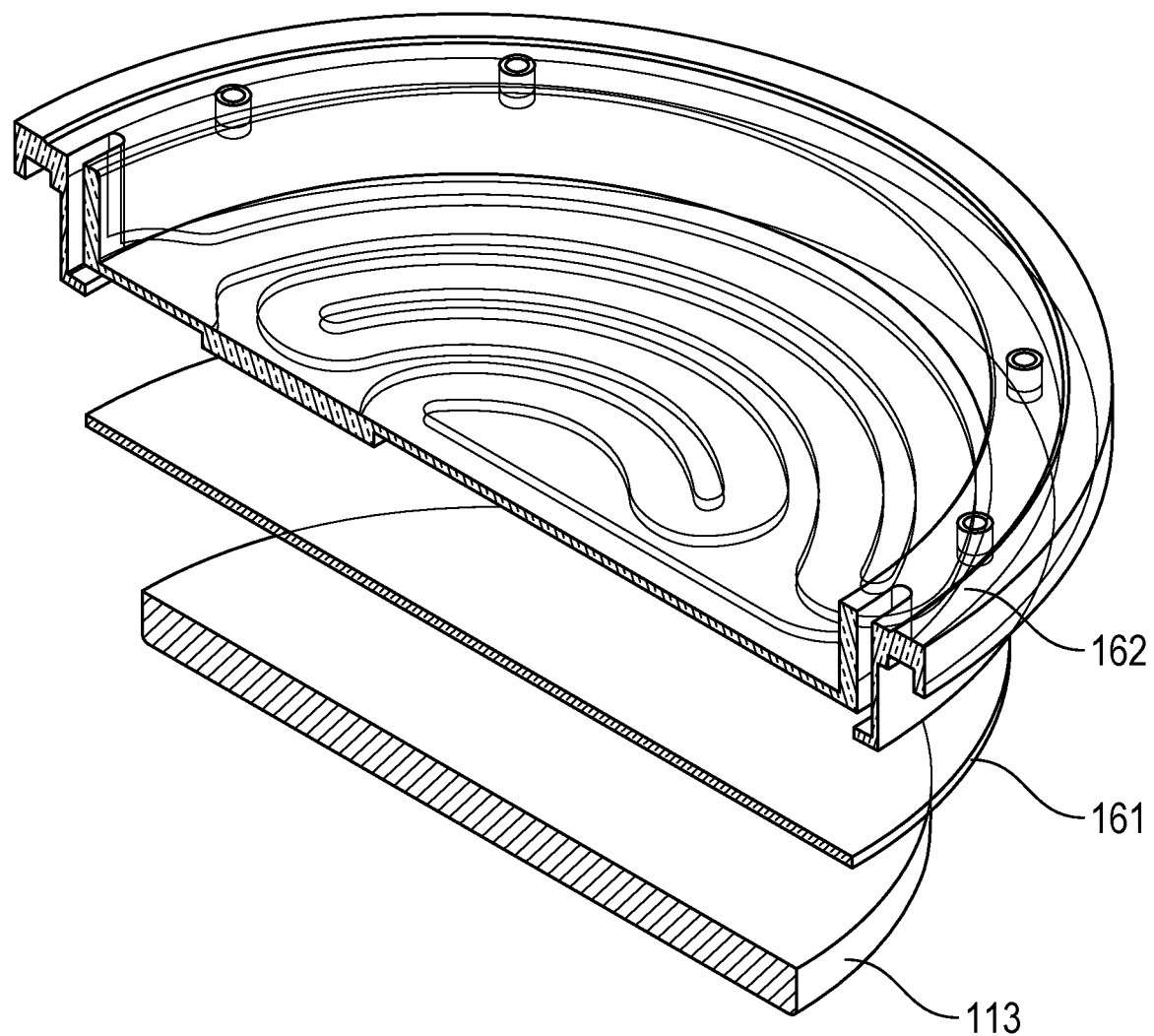
FIG. 9 illustrates an exploded perspective view of a target assembly according to an embodiment.

One or more embodiments pertain to a method of manufacturing a physical vapor deposition target assembly comprising forming backing plate having a front side and a back side, the backing plate configured to support a source material on a front side of the backing plate. The method further comprises forming a cooling channel in the backing plate including an inlet end configured to be connected to cooling fluid, an outlet end fluidly coupled to the inlet end, and the cooling channel comprising a plurality of arcs joined together by a plurality of bends between the inlet end and the outlet end, the backing plate configured to be to cool the source material during a physical vapor deposition process. With reference to FIG. 9, specific embodiments comprise assembling a cover plate 162 to the back side of the backing plate 161 and electron beam welding the cover plate and the backing plate together. Brazing paste is placed between the backing plate 161 and the cover plate 162. Electron beam (E-beam) welding is then utilized to fasten the backing plate 161 and the cover plate 162 together. Thereafter, the fastened components can be heated to complete the fastening process, and then the fastened components may be machined to the final tolerance and specifications. Then the source material in the form of a target can be bonded to the backing plate 161 or cover plate 162 with indium solder.

As mentioned above, the backing plate 161 comprises a monolithic material formed by a 3D printing process in which layers of backing plate material are progressively deposited and fused to form the plate and channels. In specific embodiments in which a 3D printing process is used, there is no need for a cover plate, and the backing plate assembly comprises a monolithic backing plate 161 and the target assembled to the backing plate 161.

In some embodiments, such as the embodiment shown in FIG. 5 and FIG. 6, a fluid tight seal between the backing plate 361 and the cover plate 362 is not necessary because the cooling fluid is contained within cooling tube 380 which is disposed within the channels 369. In other embodiments, a cover plate 362 is not required at all, as the cooling fluid is contained within the cooling tube 380.

In a specific first embodiment, physical vapor deposition target assembly 360 comprises a source material 313 and a backing plate 361 having a front side 370 and a back side 372, the backing plate 361 configured to support the source material 313 on the front side 370 of the backing plate 361. The first embodiment further comprises a cooling tube 380 including an inlet end 390 configured to be connected to cooling fluid, an outlet end 392 fluidly coupled to the inlet end, and a plurality of bends 396 between the inlet end 390 and the outlet end 392, the cooling tube 380 configured to be placed adjacent the back side 372 of the of the backing plate 361 to cool the backing plate and the source material 313 during a physical vapor deposition process.

In a second embodiment, the cooling tube 380 is separate from the backing plate 361 and the cooling tube provides a closed cooling loop containing the cooling fluid. In other words, the cooling fluid or cooling liquid is not in direct contact with the channels 369 in the backing plate.

Figure 8:
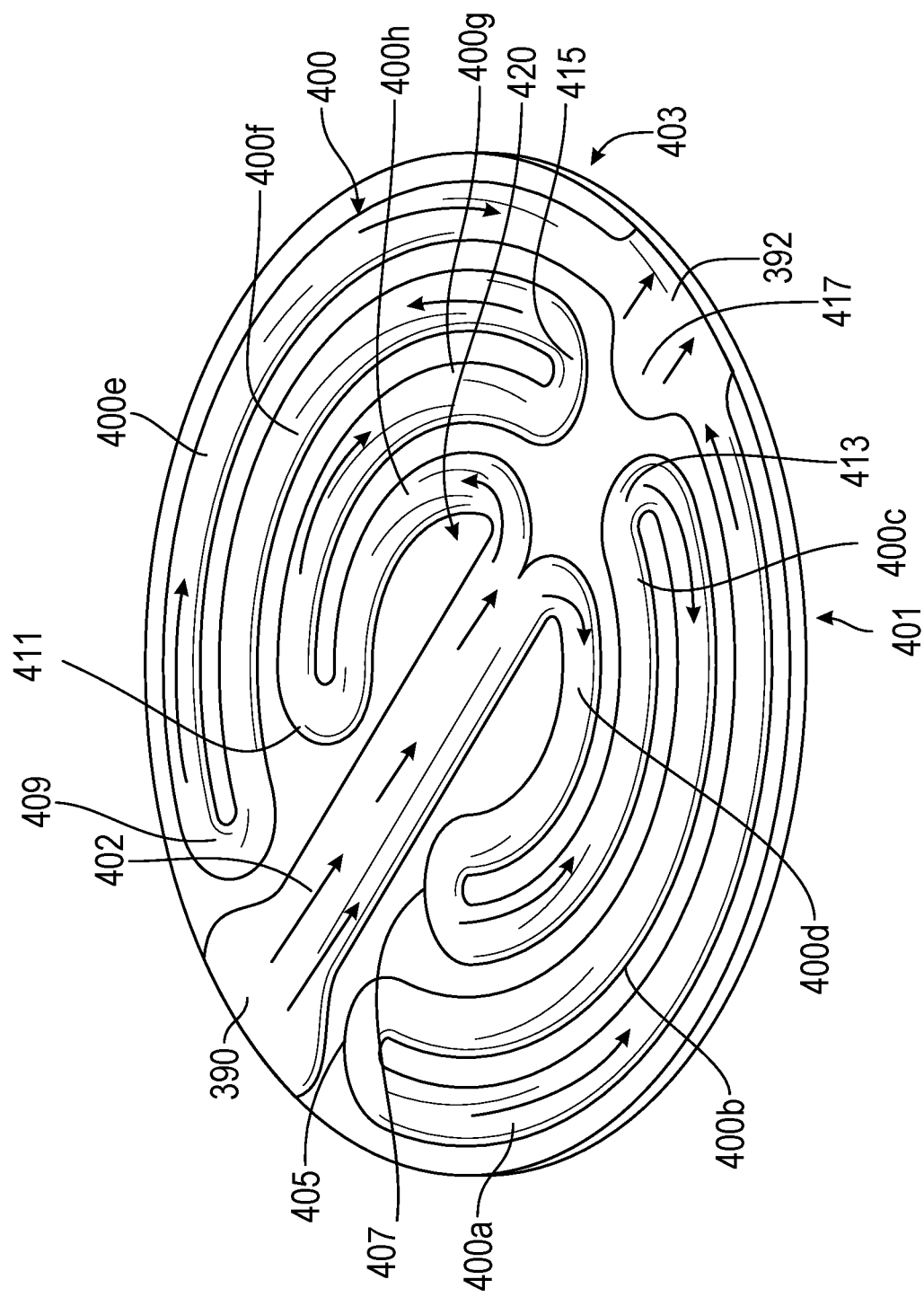
FIG. 8 illustrates channels defining a flow pattern according to an embodiment.

As discussed above, the cooling fluid can flow through the cooling tube having a plurality of bends, or the cooling fluid can flow through channels between the backing plate 361 and the cover plate 362. In either case, the cooling tube 380 or the channels 369 provide a fluid conduit through which cooling fluid flows and defines a fluid flow pattern. FIG. 8 shows an exemplary embodiments of a flow pattern, which may comprise a cooling tube 380 having a plurality of bends 396 as shown in FIG. 5 or may comprise channels formed between a backing plate 361 and a cover plate 362, for example, as shown in FIGS. 7A, 7B and 7C

In FIG. 8, a flow pattern or flow path is shown comprising a plurality of arcs 400, which in the embodiment shown, the arcs are substantially concentric. In the specific embodiment shown, there are at least eight arcs 400, and a single inlet and a single outlet. In FIG. 8, an inlet end 390 is fluidly connected to an inlet row 402. In FIG. 8, arc 400a and arc 400b form a first pair of arcs, and arc 400c, and arc 400d form a second pair of arcs. The first pair of arcs comprising arcs 400a and 400b are fluidly connected to the second pair of arcs comprising arc 400e and 400f by a split connection 420. Thus, in FIG. 8, inlet row 402 is fluidly connected to the inlet end, which is fluidly connected to the split connection 420, which divides or splits flow of the fluid to the first pair of arcs comprised of arc 400a and arc 400b and the second pair of arcs comprised of arc 400e and 400f. In some embodiments, the flow pattern includes arc 400a, arc 400b, arc 400c and arc 400d on a first side 401 of the inlet row 402, and arcs 400e, 400f, 400g and 400h on a second side 403 of inlet row 402. Thus, the first side 401 includes two pairs of arcs and the second side 403 opposite the first side includes two pairs of arcs. Still referring to FIG. 8, the adjacent arcs of a pair of the flow pattern are fluidly coupled at bends. Thus, in FIG. 8, arc 400a and arc 400b are fluidly coupled at bend 405, arc 400c and arc 400d are fluidly coupled at bend 407, arc 400e and arc 400f are coupled at bend 409, and arc 400g and arc 400h are coupled at bend 411. Bend 413 fluidly couples arc 400b and arc 400c, and bend 415 fluidly couples arc 400f and arc 400g. Bend 417 provides the split connection 420 that fluidly couples inlet arc 402 with arc 400d and arc 400h. Thus, the split connection 420 is considered a three-way connection. In FIG. 8, the arrows indicate the direction of fluid flowing within the arcs. Thus, fluid which may be a liquid flow through inlet end 390, along inlet row 402, to split connection 420, where the flow diverges in two directions, toward first side 401 and toward second side 403. On first side, fluid flows in arc 400d in an opposite direction to the flow in inlet row 402, around bend 407, and then in arc 400c in the same direction of the flow in inlet row 402, then around bend 413 and in arc 400b in a direction opposite to the flow direction in inlet row 402 and around bend 405 and in arc 400a in the same direction as in inlet row 402. The fluid flows from arc 400a toward outlet end 392. A similar flow pattern occurs on the second side 403, where fluid in the form of liquid flows in the direction shown in inlet row 402, to the split connection 420, then to arc 400h in a direction opposite the flow direction in inlet row 402, around bend 411, then in arc 400g in the same direction of flow as in inlet row 402, around bend 415 and to arc 400f in a direction opposite the flow in inlet row 402, around bend 409 and in arc 400e in the same flow direction as inlet row 402. The fluid flows from inlet row 402 toward outlet end 392, where the fluid is then recirculated and cooled according to one or more embodiments. Thus, in the embodiment shown, there are at least eight arcs 400, and at least five bends, and a single inlet and a single outlet. The inlet end and outlet end shown in the embodiment depicted in FIG. 8 can be reversed, which results in the flow of fluid in a reverse direction compared to the discussion immediately above.

In a third embodiment, the first or second embodiment can be modified so that the plurality of bends define a flow pattern includes a plurality of arcs and the backing plate further comprises a channel in the back side configured to receive a cooling tube. In a fourth embodiment, the first through third embodiments are such that the plurality of bends define a flow pattern including a plurality of arcs and the backing plate further comprises a channel in the back side configured to receive cooling tube.

In a fifth embodiment, the first through the fourth embodiments can be modified so that the flow pattern comprises at least four arcs and at least two bends. In a sixth embodiment, the first through the fourth embodiments can be modified so that the flow pattern comprises at least six arcs and five bends. In a seventh embodiment, the first through the fourth embodiments can be modified so that the flow pattern comprises at least eight arcs and six bends.

In an eighth embodiment, the flow pattern comprises a first pair of arcs and a second pair of arcs, the inlet end fluidly connected to a single arc fluidly connected to the first pair of arcs and second pair of arcs by a split connection, and the outlet end fluidly connected to the first pair of arcs and second pair of arcs. In a ninth embodiment, the flow pattern comprises a first pair of arcs and a second pair of arcs, the inlet end fluidly connected to a single row fluidly connected to the first pair of arcs and second pair of arcs by a split connection, and the outlet end fluidly connected to the first pair of arcs and second pair of arcs.

In one or more embodiments, the cooling tube comprises a single inlet end and a single outlet end. In one or more embodiments, the cooling tube comprises a single inlet end and a first outlet end and a second outlet end, the first outlet end fluidly connected to the first pair of arcs and the second outlet end fluidly connected to the second pair of arcs. In one or more embodiments, the assembly further comprises a cover plate, the cooling tube disposed between the backing plate and the cover plate. In one or more embodiments, the cooling tube or channel comprises at least one of multiple inlet ends and multiple outlet ends. This means the cooling tube can have multiple inlet ends and a single outlet end, a single inlet end and multiple outlet ends, or multiple inlet ends and multiple outlet ends. In one or more embodiments with multiple inlet ends, all inlet ends may be connected to a single supply conduit or may be fluidly connected multiple supply conduits. Similarly, in embodiments with multiple outlet ends, all outlet ends may be connected to a single return conduit or may be fluidly connected to multiple return conduits.

One or more embodiments pertain to a physical vapor deposition target assembly comprising a source material; a backing plate having a front side and a back side, the backing plate configured to support the source material on a front side of the backing plate; and a cover plate coupled to the backing plate, wherein channels are disposed between the cover plate and the backing plate, the channels including a plurality of bends defining a flow pattern including at least four arcs and at least three bends, the at least four arcs and three bends fluidly connected to an inlet end and an outlet end, the channels configured to flow cooling fluid adjacent the back side of the of the backing plate to cool the backing plate and the target during a physical vapor deposition process.

In one or more embodiments, the channels define a flow pattern including at least five arcs including an inlet row fluidly connected to the inlet end, the inlet row fluidly connected to a first pair of arcs and a second pair of arcs by a split connection. In one or more embodiments, the channels define a flow pattern comprising at least six arcs and five bends. In one or more embodiments, the channels define a flow pattern comprising at least eight arcs and six bends.

In one or more embodiments, the channels define a flow pattern comprising a first pair of arcs and a second pair of arcs, the inlet end fluidly connected to a single row fluidly connected to the first pair of arcs and second pair of arcs by a split connection, and the outlet end fluidly connected to the first pair of arcs and second pair of arcs. In one or more embodiments, the channels are fluidly connected to a single inlet end and a single outlet end. In one or more embodiments, the channels are fluidly connected to a single inlet end and a first outlet end and a second outlet end, the first outlet end fluidly connected to the first pair of arcs and the second outlet end fluidly connected to the second pair of arcs. In specific embodiments, the channels are fluidly connected to at least one of multiple inlet ends and multiple outlet ends. This means the channels can have multiple inlet ends and a single outlet end, a single inlet end and multiple outlet ends, or multiple inlet ends and multiple outlet ends. In one or more embodiments with multiple inlet ends, all inlet ends may be connected to a single supply conduit or may be fluidly connected by multiple supply conduits. Similarly, in embodiments with multiple outlet ends, all outlet ends may be fluidly connected to a single return conduit or to multiple return conduits.

In specific embodiments, tubing is disposed within said channels and fluidly connected to the inlet end and the outlet end.

Another aspect pertains to a method of cooling a physical vapor deposition target, the method comprising continuously flowing cooling fluid through the apparatus described herein.

One or more embodiments of the physical vapor deposition target assemblies described herein can be used in a PVD processing system 100 as shown in FIG. 1. In one or more embodiments, continuously flowing cooling fluid in the form of liquid through the apparatus replaces the cooling fluid such that fresh coolant fluid continuously contacts the backing plate. Such a design advantageously has shown in modelling to provide a significant reduction in target temperature compared to current designs of the type shown in FIGS. 2 and 3. In addition, the curved cooling channels in the form of concentric arcs provide more uniform cooling of the source material, which minimizes the temperature difference across the source material, and reducing thermal stress. In addition, preliminary modelling data shows that with a rotating magnet design in a multi-cathode PVD reactor, a more uniform erosion profile of the source material compared to existing designs. The erosion profile was mapped on a source material (target) in terms of heat flux using a curve fitting function.

The design described in this disclosure provides continuous replacement of cooling fluid/liquid which solves the problem of providing more effective and efficient heat transfer, resulting in better target cooling and generation of fewer particles and prevention of warping of the target. Cooling fluid in the form of liquid such as water is supplied from one end and exits from another end of the channels after passing through a tortuous path, which may be a serpentine path including several twists, turns and bends. The design also advantageously extends the target life. These benefits were shown using three-dimensional conjugate modeling and comparing existing target assembly designs with the target assembly designs described herein.

The target assemblies described herein may be particularly useful in the manufacture of extreme ultraviolet (EUV) mask blanks. An EUV mask blank is an optically flat structure used for forming a reflective mask having a mask pattern. In one or more embodiments, the reflective surface of the EUV mask blank forms a flat focal plane for reflecting the incident light, such as the extreme ultraviolet light. An EUV mask blank comprises a substrate providing structural support to an extreme ultraviolet reflective element such as an EUV reticle. In one or more embodiments, the substrate is made from a material having a low coefficient of thermal expansion (CTE) to provide stability during temperature changes. The substrate according to one or more embodiments is formed from a material such as silicon, glass, oxides, ceramics, glass ceramics, or a combination thereof.

An EUV mask blank includes a multilayer stack, which is a structure that is reflective to extreme ultraviolet light. The multilayer stack includes alternating reflective layers of a first reflective layer and a second reflective layer. The first reflective layer and the second reflective layer form a reflective pair. In a non-limiting embodiment, the multilayer stack includes a range of 20-60 of the reflective pairs for a total of up to 120 reflective layers.

The first reflective layer and the second reflective layer can be formed from a variety of materials. In an embodiment, the first reflective layer and the second reflective layer are formed from silicon and molybdenum, respectively. The multilayer stack forms a reflective structure by having alternating thin layers of materials with different optical properties to create a Bragg reflector or mirror. The alternating layer of, for example, molybdenum and silicon can be formed by physical vapor deposition, for example, in a multi-cathode source chamber.

Figure 10:
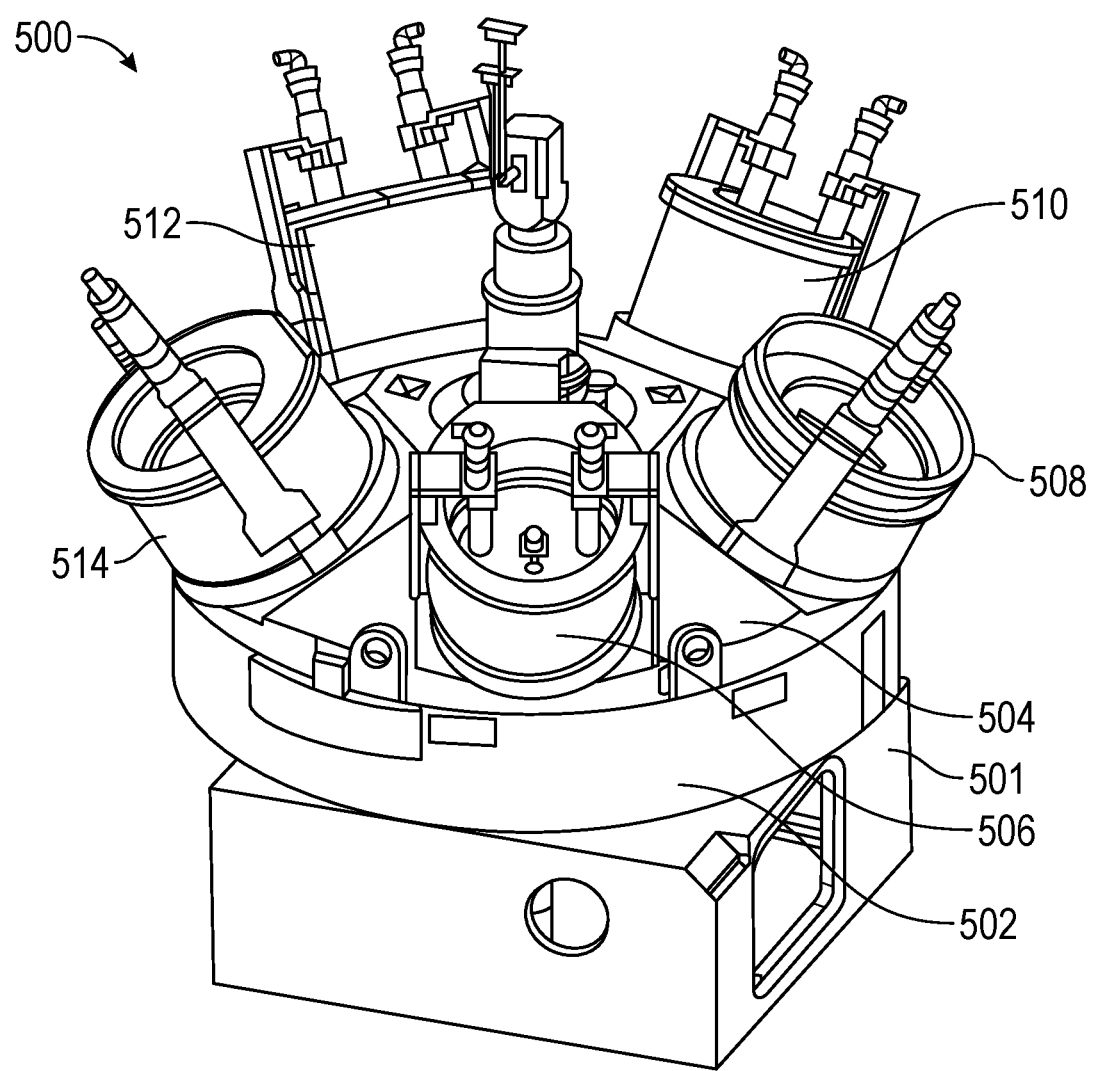
FIG. 10 illustrates a multi-cathode PVD deposition chamber according to an embodiment.

Referring now to FIG. 10, an upper portion of a multi-cathode source chamber 500 is shown in accordance with an embodiment. The multi-cathode chamber 500 includes a base structure 501 with a cylindrical body portion 502 capped by a top adapter 504. The top adapter 504 has provisions for a number of cathode sources, such as cathode sources 506, 508, 510, 512, and 514, positioned around the top adapter 504. The PVD processing system 100 described with respect to FIG. 1 can be utilized in the multi-cathode source chamber 500 to form the multilayer stack, as well as capping layers and absorber layers. For example, the physical vapor deposition systems can form layers of silicon, molybdenum, titanium oxide, titanium dioxide, ruthenium oxide, niobium oxide, ruthenium tungsten, ruthenium molybdenum, ruthenium niobium, chromium, tantalum, nitrides, compounds, or a combination thereof. Although some compounds are described as an oxide, it is understood that the compounds can include oxides, dioxides, atomic mixtures having oxygen atoms, or a combination thereof.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A multi-cathode physical vapor deposition chamber comprising:
    a top adapter;
    a plurality of cathodes positioned around the top adapter, each of the plurality of cathodes comprising a target assembly including:
    a source material;
    a backing plate having a front side and a back side, the backing plate configured to support the source material on the front side of the backing plate; and
    a cooling channel formed in the backing plate including a single inlet end configured to be connected to a cooling fluid, a single inlet conduit and a single outlet having a single outlet end fluidly coupled to the single inlet end, and the cooling channel comprising a plurality of arcs joined together by a plurality of bends between the single inlet end and the single outlet end, the single inlet conduit dividing a first pair of arcs on a first side of the single inlet conduit and a second pair of arcs on a second side of the single inlet conduit, the cooling fluid in the cooling channel configured to cool the backing plate and the source material during a physical vapor deposition process.

2. The multi-cathode physical vapor deposition chamber of claim 1, the target assembly of each of the plurality of cathodes further comprising a cooling tube that provides a closed cooling loop containing the cooling fluid, the cooling tube disposed adjacent the cooling channel.

3. The multi-cathode physical vapor deposition chamber of claim 1, the plurality of bends of the target assembly of each of the plurality of cathodes defining a flow pattern including a plurality of concentric arcs.

4. The multi-cathode physical vapor deposition chamber of claim 3, the flow pattern comprising at least four arcs and five bends.

5. The multi-cathode physical vapor deposition chamber of claim 3, the flow pattern comprising at least eight arcs and six bends.

6. The multi-cathode physical vapor deposition chamber of claim 3, the single inlet end of the target assembly of each of the plurality of cathodes fluidly connected to the first pair of arcs and a second pair of arcs by a split connection, and the single outlet fluidly connected to the first pair of arcs and the second pair of arcs.

7. The multi-cathode physical vapor deposition chamber of claim 3, the single inlet end of the target assembly of each of the plurality of cathodes fluidly connected to the single inlet conduit fluidly connected to the first pair of arcs and second pair of arcs by a split connection, and the single outlet end fluidly connected to the first pair of arcs and second pair of arcs.

8. The multi-cathode physical vapor deposition chamber of claim 2, the target assembly of each of the plurality of cathodes further comprising a cover plate, the cooling tube disposed between the backing plate and the cover plate.

9. The multi-cathode physical vapor deposition chamber of claim 8, wherein the cover plate and the backing plate of the target assembly of each of the plurality of cathodes comprise a metal alloy having an electrical conductivity in a range of about 20-30% of International Annealed Copper Standard (IACS) and a thermal conductivity in a range of about 120-150 W/mK.

10. The multi-cathode physical vapor deposition chamber of claim 9, wherein the cover plate and the backing plate of the target assembly of each of the plurality of cathodes comprise a metal alloy selected from a copper-nickel-silicon-chromium metal alloy and copper-zinc metal alloy containing lead and iron.

11. The multi-cathode physical vapor deposition chamber of claim 1, wherein the backing plate comprises a metal alloy having an electrical conductivity in a range of about 20-30% of International Annealed Copper Standard (IACS) and a thermal conductivity in a range of about 120-150 W/mK.

12. The multi-cathode physical vapor deposition chamber of claim 11, wherein the backing plate of the target assembly of each of the plurality of cathodes comprises a metal alloy selected from a copper-nickel-silicon-chromium metal alloy and copper-zinc metal alloy containing lead and iron.

13. The multi-cathode physical vapor deposition chamber of claim 1, wherein the plurality of cathodes comprise a plurality of source materials to form a multilayer stack of a first reflective layer and a second reflective layer and an absorber of an EUV mask blank.

14. A method of manufacturing an EUV mask blank comprising depositing a multilayer stack of a first reflective layer and a second reflective layer and an absorber utilizing the multi-cathode physical vapor deposition chamber of claim 1.

* * * * *